United States Patent
Conway

(10) Patent No.: US 7,443,933 B2
(45) Date of Patent: Oct. 28, 2008

(54) DATA DETECTOR SYSTEM

(75) Inventor: Thomas J. Conway, County Offaly (IE)

(73) Assignee: University of Limerick, Limerick (IE)

( * ) Notice: Subject to any disclaimer, the term of this patent is extended or adjusted under 35 U.S.C. 154(b) by 622 days.

(21) Appl. No.: 11/101,641

(22) Filed: Apr. 8, 2005

(65) Prior Publication Data

US 2005/0238122 A1 Oct. 27, 2005

Related U.S. Application Data

(63) Continuation of application No. PCT/IE03/000142, filed on Oct. 8, 2002.

(30) Foreign Application Priority Data

Oct. 8, 2002 (IE) .................................. 2002/0803

(51) Int. Cl.
*H03D 1/00* (2006.01)
*H04L 27/06* (2006.01)

(52) U.S. Cl. ..................... 375/341; 375/340; 704/242

(58) Field of Classification Search .................. 375/265, 375/340, 341; 704/242
See application file for complete search history.

(56) References Cited

U.S. PATENT DOCUMENTS

| | | | |
|---|---|---|---|
| 5,774,444 A | 6/1998 | Shimano et al. | 369/109 |
| 5,959,953 A | 9/1999 | Alon | 369/44 |
| 6,233,214 B1 | 5/2001 | Hayashi | 369/59 |
| 2002/0126773 A1* | 9/2002 | Brunel | 375/340 |

FOREIGN PATENT DOCUMENTS

| | | |
|---|---|---|
| EP | 0789353 | 8/1997 |
| WO | WO02/054394 | 7/2002 |

* cited by examiner

*Primary Examiner*—Curtis B Odom
(74) *Attorney, Agent, or Firm*—Jacobson Holman PLLC

(57) ABSTRACT

A detector system detects values on a storage medium where there is ISI. The symbols are stored as pits in a close hexagonal lattice having u, v, and x dimensions at mutual 60° separations from an individual pit. The value for a particular symbol is determined by generating an estimate for the symbol in each of the u, v, and x dimensions. These estimates are used to generate a decision for the symbol as it is at the intersection of these dimensions. Thus a number of 1-dimensional detectors can be used although the platform is two-dimensional with ISI.

15 Claims, 10 Drawing Sheets

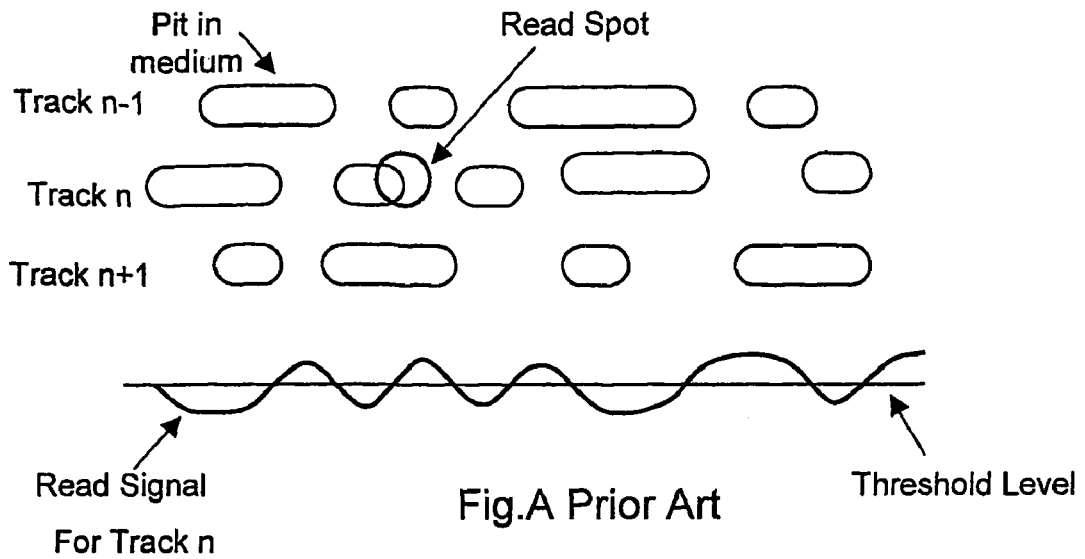
Fig.A Prior Art
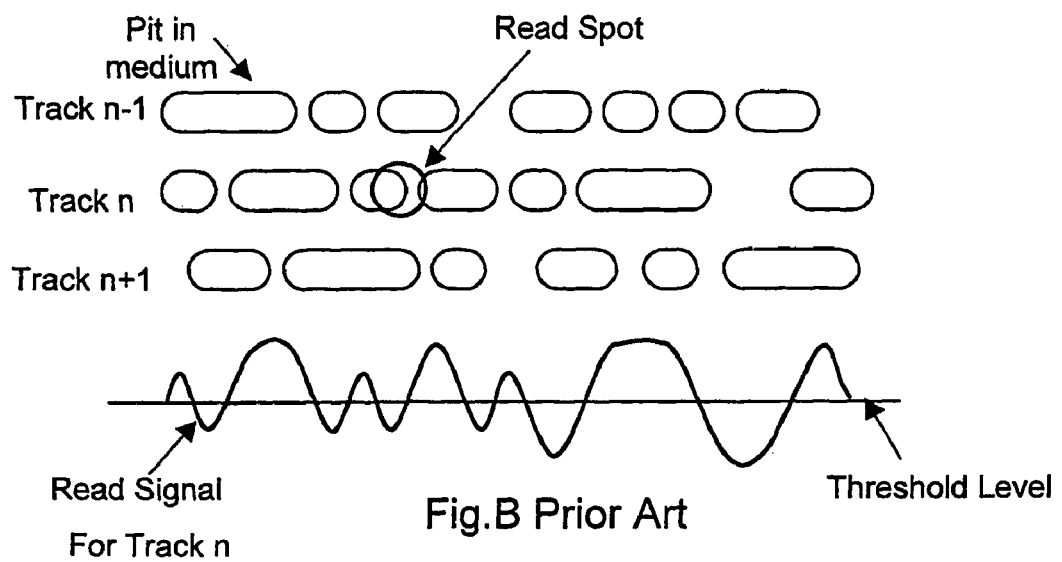
Fig.B Prior Art
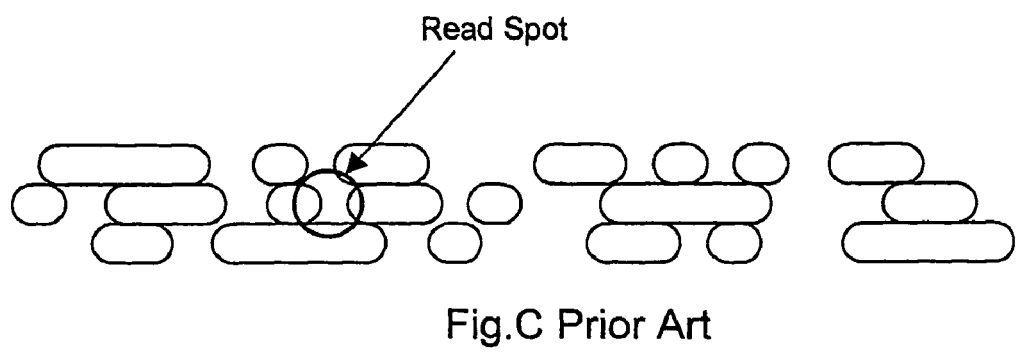
Fig.C Prior Art

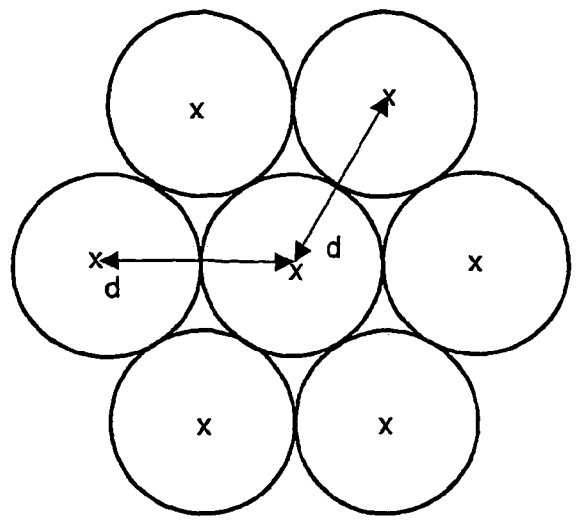
Fig.D
Prior Art
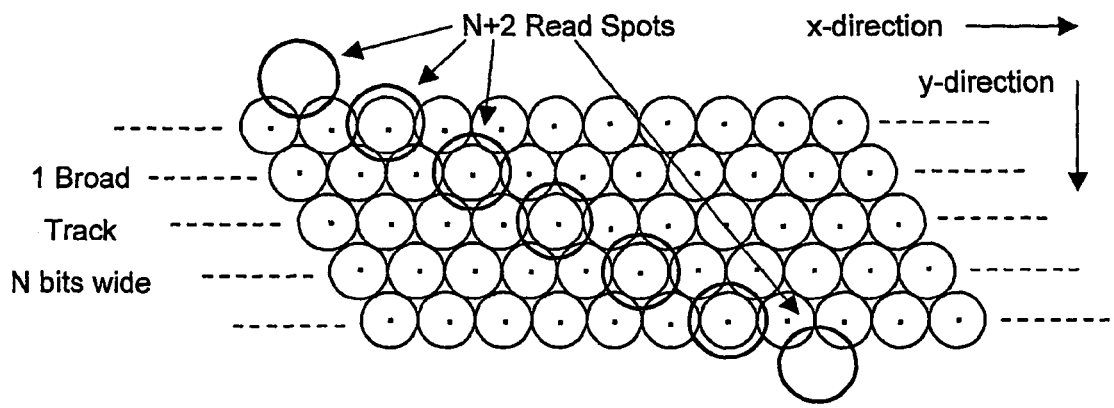
Fig.E
Prior Art
$\quad\; o^{h_1} \quad\; o^{h_1}$
$h_1 \quad\; h_0 \quad\; h_1$
$o \quad\;\; o \quad\;\; o$
$\quad\; o^{h_1} \quad\; o^{h_1}$ Fig.F
Prior Art

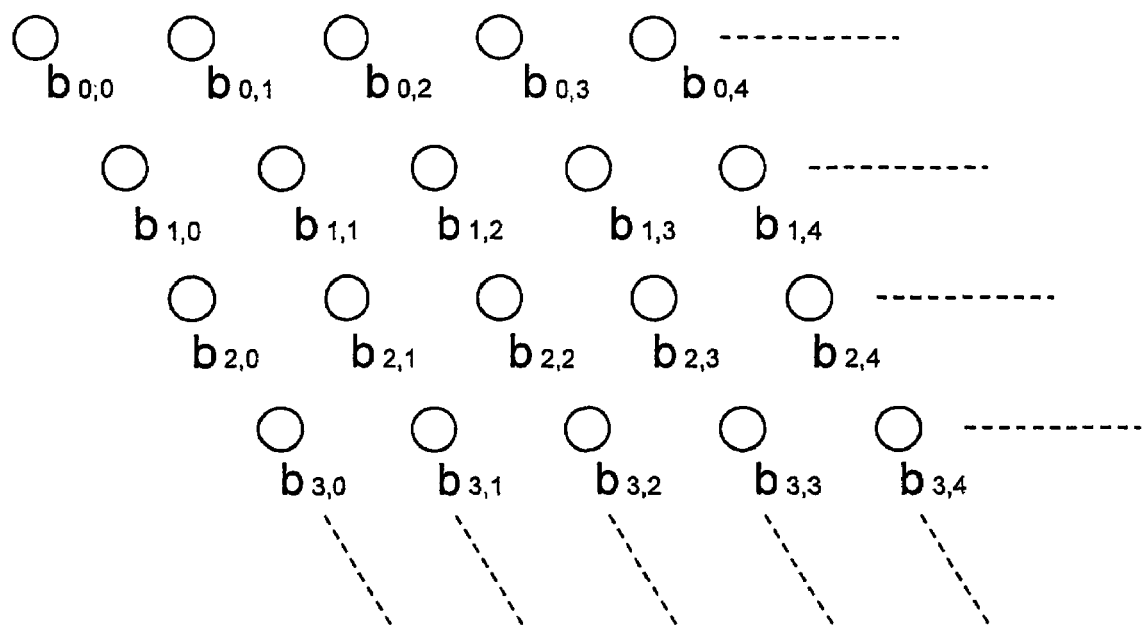
Fig.G

Simulation Performance

~346 ADDER/COMPARATOR OPERATIONS PER BIT

~263 ADDER/COMPARATOR OPERATIONS PER BIT

DATA DETECTOR SYSTEM

This is a continuation of PCT/IE03/000142 filed Oct. 8, 2002 and published in English.

FIELD OF THE INVENTION

The invention relates to a system for data detection and recovery from an optical data storage medium.

PRIOR ART DISCUSSION

In the field of data storage and recovery there have been many attempts to provide reliable data storage and recovery with improved storage densities and optimum read output. Some of the approaches of the prior art are discussed below.

FIG. A illustrates a simple data storage and recovery arrangement in which a transducer produces a signal in response to data stored in a region of an optical storage medium. There are physical limitations associated with transducers, for example optical disks are read using a focused light spot from a laser but the minimum diameter of the spot is limited by diffraction to a size of the order of the light wavelength used. Data is stored with a data bit 1 represented as a pit in the medium, which reduces the reflected light intensity and a data bit 0 represented with the absence of a pit. The data is recovered by comparing the received signal to a reference level. In the example illustrated the bit sizes are greater than the spot size and can be individually detected. However storage density is limited by the size of the spot.

Referring to FIG. B, this is an example of data storage in which data bit size has been reduced, and in which the tracks are separated by a distance by a guard band in the "vertical" direction but there may still be interference in the horizontal direction.

Such an arrangement results in Inter-Symbol Interference (ISI) but the read signal can still be detected by comparison to a threshold level and by using maximum likelihood detection by application of the Viterbi algorithm. The system is however more prone to errors when noise is present and the guard band represents wasted space on the storage medium.

FIG. C illustrates an example of data storage with ISI in which the tracks are adjacent, however in this case there is ISI in both the horizontal and vertical directions.

Data may also be stored in a 2-dimensional pattern for example in rectangular grids or as circular pits in a hexagonal lattice, as illustrated in FIG. D. Data is also written and read in a fundamentally 2-dimensional format by reading with a single spot and creating a 2-dimensional sampled description using a large memory buffer. For optimum read output it is desirable to read a data storage medium with an array of spots to create a 2-dimensional sampled description and a high speed read function. The problem of ISI persists and there remains a need for increased storage densities.

Regardless of the storage medium there remains an interest in increasing storage densities and access speeds and in reducing costs and error rates.

With reference to FIGS. E, F, and G, an example 2-dimensional sampled description of data is illustrated.

Referring to FIG. E, a scheme for reading a storage medium with an array of spots thus creating a 2-dimensional sampled description is illustrated. Each broad track represents a band of N bits wide. The N+2 read spots move in the x direction thus producing N+2 read signals. Note that the outer two spots can be omitted with some reduction in performance if required. A guard band may still be required between broad tracks but will result in a small loss of storage capacity provided N is large. It is desirable that the pit size be as small as possible and advantageous if it can be smaller that the read spot size. However, this leads to ISI in all directions.

Considering a case in which the only significant ISI is from the six neighbours that are closest to the bit of interest, it is assumed that there is little or no interference from the bits that are further away, or that such interference is compensated for with a suitable 2D equaliser, in which case the 2-D impulse would be as shown in Fig. F. If the data storage bits are labelled as shown in FIGS. F and G the channel output from the channel in FIG. F may be written as a two-dimensional convolution.

Considering a system with $N_R$ rows of binary data in each broad track, optimum detection can in theory be performed with the Viterbi algorithm. In this 2D case such a detector can be designed by considering two diagonal rows of data as the state information with the input being $N_R$ bits. This would hence require a detector with $2^{2N_R}$ states each of which would have $2^{N_R}$ branches. For example, if $N_R=10$ which might be a reasonable value, there are $2^{20}=1048576$ states with each having 1024 branches. Such a detector would be extremely complex and probably infeasible to implement.

The invention is therefore directed towards providing a data detector system and method for simpler operation where there is high density storage and ISI.

SUMMARY OF THE INVENTION

According to the invention, there is provided a method of processing stored data read from a storage medium in which the data is stored in a lattice arrangement of symbols, the method comprising the steps of:
  (a) a detector generating an estimate for each symbol in a linear dimension;
  (b) a detector generating an estimate for each symbol in a different non-orthogonal linear dimension; and
  (c) a processor using all estimates to generate a decision for a symbol at the intersection of the dimensions.

In one embodiment, the method comprises the further step of generating a set of estimates for a third linear dimension intersecting the symbol, and additionally using these estimates for the decision.

In another embodiment, the lattice is hexagonal.

In a further embodiment, the method comprises the further step of generating a set of estimates for a third linear dimension intersecting the symbol, and additionally using these estimates for the decision; and the three dimensions intersect the intersection symbol at 60° mutual angles.

In one embodiment, soft decision detectors are used for the dimension estimates, and a Viterbi decoder is used for the symbol decision.

In another embodiment, the Viterbi detector also generates an estimate for a dimension before generating the symbol decision.

In a further embodiment, the detectors for each dimension implement a 1+D MAP algorithm.

In one embodiment, the method comprises the further steps of iterating by feeding back estimates for the symbols of a final dimension to the preceding dimension detectors as a priori information.

In another embodiment, the iterations are performed by different detectors.

In a further embodiment, a detector for a first dimension has more status than one for a second dimension, and a detector for the second dimension has more status than one for a third dimension, said detectors being in series.

In another embodiment, said first detector has five states with inputs 0, 1, 2, 3, 4, the second detector has three states with inputs 0, 1, 2, and the third detector has two states with inputs 0, 1.

In a further embodiment, estimates are generated for each dimension in parallel by detectors receiving input samples in parallel.

In one embodiment, outputs of each detector are fed back to the other detectors.

In another embodiment, a first dimension estimate detector implements a folded trellis with mapping to a reduced number of states.

In a further embodiment, all even states are mapped to an even state and all odd states are mapped to an odd state.

The invention also provides a data detector system comprising detectors and a processor for implementing a method as defined above.

DETAILED DESCRIPTION OF THE INVENTION

Brief Description of the Drawings

The invention will be more clearly understood from the following description of some embodiments thereof, given by way of example only with reference to the accompanying drawings in which.

DESCRIPTION OF THE EMBODIMENTS

In the invention an array of pits is read. The read values are normalised (de-skewed) from hexagonal and written into an orthogonal grid array of values to memory. The processor then decodes a row of values for pits in the v direction. This provides an estimate of the value for each pit of the array in the v direction. These estimates take into account the overlaps between adjoining pits in the v direction and also the noise from the remaining pits in the six surrounding pits in a hexagonal pattern around each pit. The processor then does this for pits in the u direction. This provides a further estimate for the pit at the intersection of the v and u directions. The process is repeated for the pits in the x direction, providing a third estimate for the intersection pit. Finally, all three estimates are processed to provide an estimate for the intersection pit.

In a next iteration, the v-direction values are re-used, however in the second and third steps the values for the u and x rows intersecting the next pit in the v direction are determined.

The above is a theoretical explanation. In practice all values of the array are decoded before the decisions for individual values are made.

It will be noted that the decision for any one pit is derived taking into account the estimates for pits in the three intersecting dimensions. While this is less than the optimum number of all surrounding pits, a good result is achieved with relatively little processing.

Figure 1:
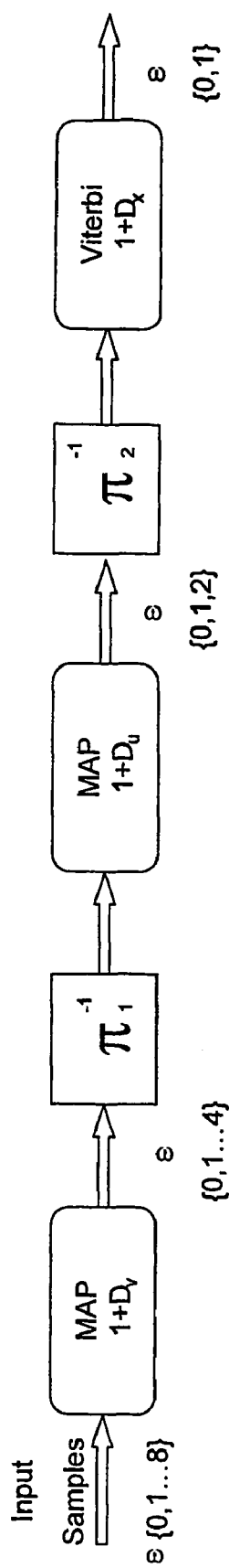
FIG. 1 is a schematic diagram illustrating an example of a serial detector of the invention.
Figure 2:
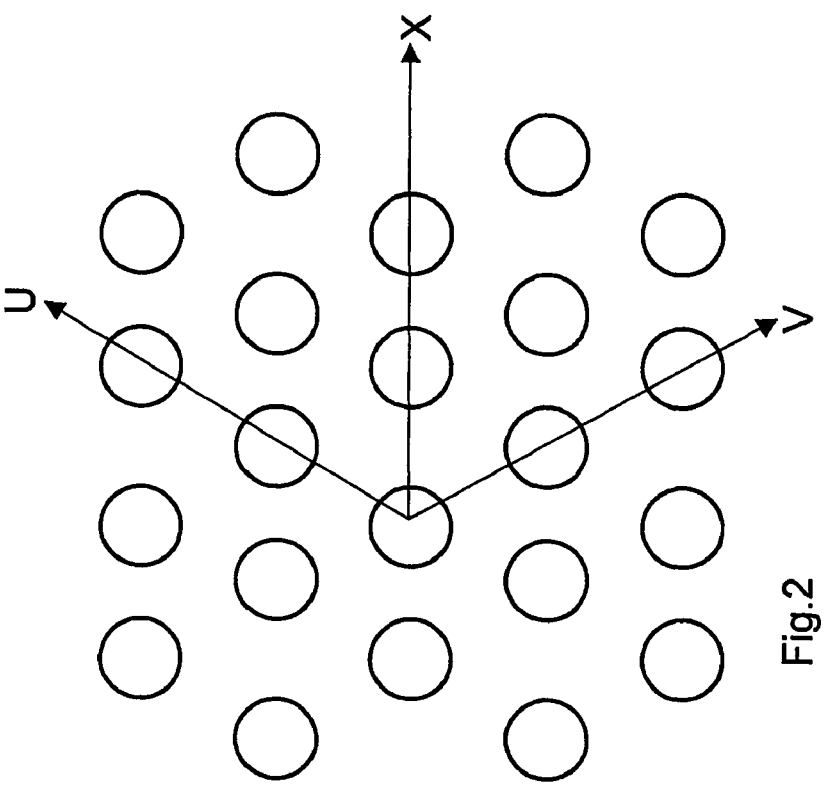
FIG. 2 is a schematic hexagonal lattice of a storage medium in which the three vector directions u, v and x are illustrated.

Referring to FIG. 1, the laser light directed on the storage medium covers an area of at least seven pits in a hexagonal pattern, with falling intensity away from this area. Thus, the reflected light has an intensity determined by the values of these at least seven pits for any one sample. A transducer converts the intensity into an electrical signal having a discrete value being one of the nine values $\{0, 1, 2 \ldots 8\}$. These are idealised values, the actual circuit voltage levels also incorporating noise.

If the number of pits in the v direction across a band is 7 and in the x direction 100, then the input to the MAP $1+D_v$ detector is an array of 95×7 values. The x dimension is only 94 because that is the number of full v lines across, excluding partial lines. Each of these samples has a value between 0 and 8.

The MAP $1+D_v$ detector processes these samples to provide a vector representing the v direction on each side of a particular pit of interest. There are six values, each being one of $\{0, 1, 2, 3, 4\}$. The $\pi_1^{-1}$ function presents a new matrix to the MAP $1+D_u$ detector, this matrix being 6 wide. The MAP $1+D_u$ detector generates output vectors 5 samples long, each having a value $\{0, 1, 2\}$. The $\pi_2^{-1}$ function generates a table 5 rows wide, and this is presented to the Viterbi $1+D_x$ detector. The Viterbi $1+D_x$ detector provides the $\{0, 1\}$ values for each individual pit. This is achieved by taking the v and u dimension estimates and the x dimension estimate into account, and then generating a hard decision output.

In more detail, as is known in the art, in one-dimensional systems the channel response can be written as a polynomial in D where the indeterminate D represents a delay of one data sample. For example the widely used PR4 response which represents the channel $y_k = x_k - x_{k-2}$ can be written as $P(D) = 1 - D^2$.

In the present invention, three indeterminants are identified as $D_u$, $D_v$, and $D_x$ which represent spatial distances of length d in the u, v, and x directions, The vectors u, v and x are linearly dependent and can be combined by noting that $D_u D_v = D_x$.

The general response may be written as:

$$P_{hex}(D_u, D_x, D_v) = H_1 D_u + H_1 D_x D_u + h_1 1 + h_0 D_x + h_1 D_x^2 + h_1 D_v + h_1 D_v D_x$$

In the present invention the response for the specific values of $h_0 = 2$ and $h_1 = 1$ (which is a response of practical interest) that the response $P_{hex}(D_u, D_x, D_v)$ may be decomposed into the product of 3 independent terms $P_1(D_u) P_1(D_x) P_1(D_v)$ with $P_1(D) = 1 + D$.

That is $$(1 + D_u)(1 + D_x)(1 + D_v) = 1 D_u + 1 D_x D_u + 1 + 2 D_x + 1 D_x^2 + 1 D_v + 1 D_v D_x$$

This decomposition of the specific channel shows that this particular impulse response to be denoted $PR1_{hex}$ can be viewed as follows:

The input bits denoted $b_{i,j} \epsilon 0,1$ are acted on by a filter $1+D_u$. The output of this filter is denoted $c_{i,j}$ and have the allowable values of $c_{i,j} \epsilon \{0,1,2\}$. These outputs are acted on by a filter $1+D_v$. The output of this filter is denoted $d_{i,j}$ and have the allowable values of $d_{i,j} \in \{0,1,2,3,4\}$. These outputs are acted on by a filter $1+D_x$. The output of this filter is denoted $y_{i,j}$ and have the allowable values of $y_{i,j} \in \{0,1,2,3,4,5,6,7,8\}$.

The order of the application of these responses is arbitrary and does not affect the system operation. This decomposition of the specific channel impulse is any value of N (number of rows). Based on the decomposition described a number of practical detection methods are disclosed. These are based on applying a soft decision detection method to each of the responses $(1+D_u)$, $(1+D_x)$ and $(1+D_v)$ independently of each other and combining the results. The soft decision detection method can be any of a number of well known methods such as MAP detection, LogMAP detection, MaxMAP detection, Soft Output Viterbi Algorithm (SOVA) or any algorithm that provides soft decision output.

When the final bit decision is required rather than a soft decision value any of a number of known hard decision methods such as Viterbi detection can also be used.

This combining phase can be based on serial or parallel concatenation or a combination of both. Examples of both a fully parallel and fully serial concatenation are given below.

It is also clearly possible to combine the serial and-parallel approaches, for example apply $(1+D_u)$ and $(1+D_v)$ detectors in parallel and then feed the result to a $(1+D_x)$ detector.

To improve the performance of the detection system further, the use of iteration can be applied.

Figure 3:
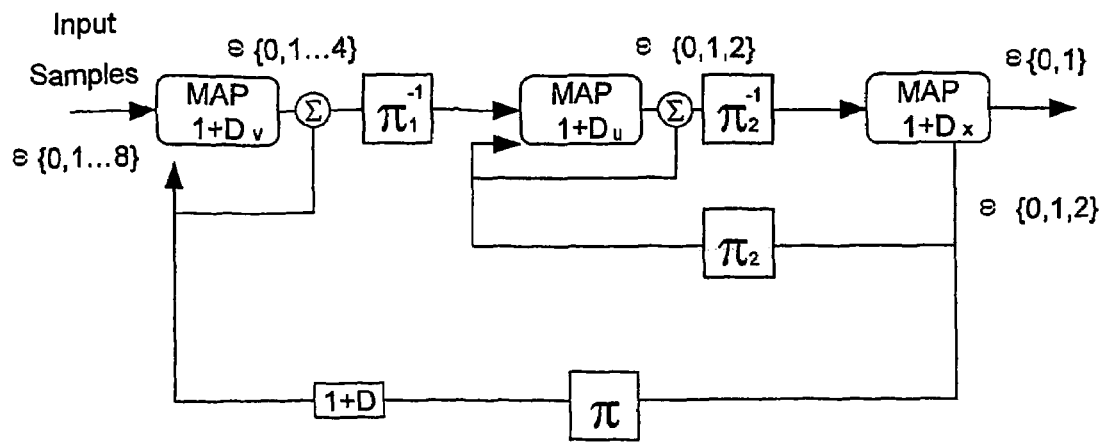
FIG. 3 is a schematic diagram illustrating an example of a serial detector of the invention, with iteration.

Referring to FIG. 3 an alternative detector, of the invention, is illustrated. This detector comprises three independent detectors MAP $1+D_v$, MAP $1+D_u$, and MAP $1+D_x$. The final detector is a MAP detector. Its outputs are fed back to the first detector and the second detector to be used as a priori information.

This allows the detection procedure to be repeated again, but with the a priori information from the first iteration. Repeatedly iterating this procedure improves the performance of the detection system and brings it closer to optimal. As shown in FIG. 3 care needs to be taken to ensure that only intrinsic information is passed in the iteration as is well understood in the area of decoding turbo codes. Typically iteration of up 10 times is required to achieve the best performance but less can be used to reduce complexity with some loss in performance.

Of course, where high speed of operation is required, a hardware implementation can implement the same iterative procedure by replicating the hardware a number of times rather that applying the data multiple times to the same hardware.

Figure 4:
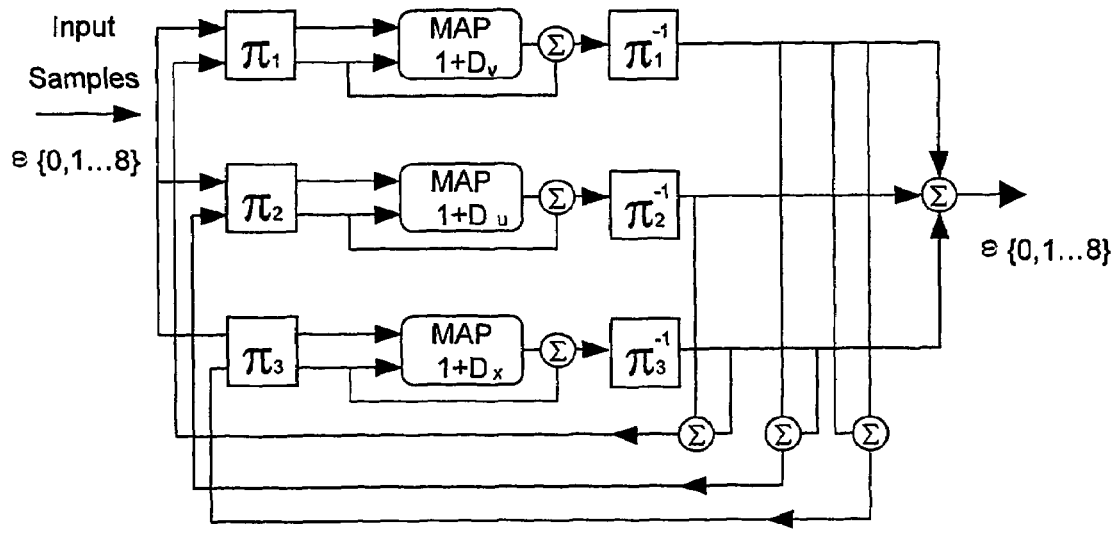
FIG. 4 is a schematic diagram illustrating an example of a parallel detector of the invention.

Referring to FIG. 4 a parallel detector is illustrated. As well as the serial concatenation of detectors described above, it is also possible to implement the detection system as a parallel scheme as illustrated in FIG. 4. This can be achieved by considering the channel sequence in each direction as being a constrained sequence. For example, a row of the channel output in the x-direction can be viewed as the sequence resulting from the application of the integer inputs $\{0, 1, 2, 3, 4\}$ being input to a 1+D channel. Thus they can be modelled as a 5 state finite state machine. Hence, the channel can be viewed as three constraints on the data in the three directions v, u and x. In this case, the received noisy data is applied to the $(1+D_u)$, $(1+D_v)$ and $(1+D_x)$ detectors simultaneously (being suitably deinterleaved). In this case each of the detectors is designed to produce reliability or likelihood information on each of the 9 possible input levels $\{0, 1, 2, 8\}$ which can be readily done by those familiar with such soft decision detectors. The likelihood information can then be combined easily (being suitably deinterleaved) to generate a resulting likelihood for the possible input levels $\{0, 1, 2, 8\}$ thus generating a more reliable decision. The actual bit can be then estimated using the detector 10 of FIG. 1 or using a simple demapping logic operation.

FIG. 4 also illustrates how information can be fed back to allow iteration to further improve the detector performance. As in the diagram, for example, the information fed back to the $(1+D_x)$ detector is the output information for the $(1+D_u)$ and $(1+D_v)$ detectors combined. It is important that information for the $(1+D_x)$ detector is not fed back to itself as this would cause instability in the system.

As in the previous case, the iteration is repeated, with 5 times being a typical number of iterations to achieve good performance.

Example Performance Simulations

Figure 5:
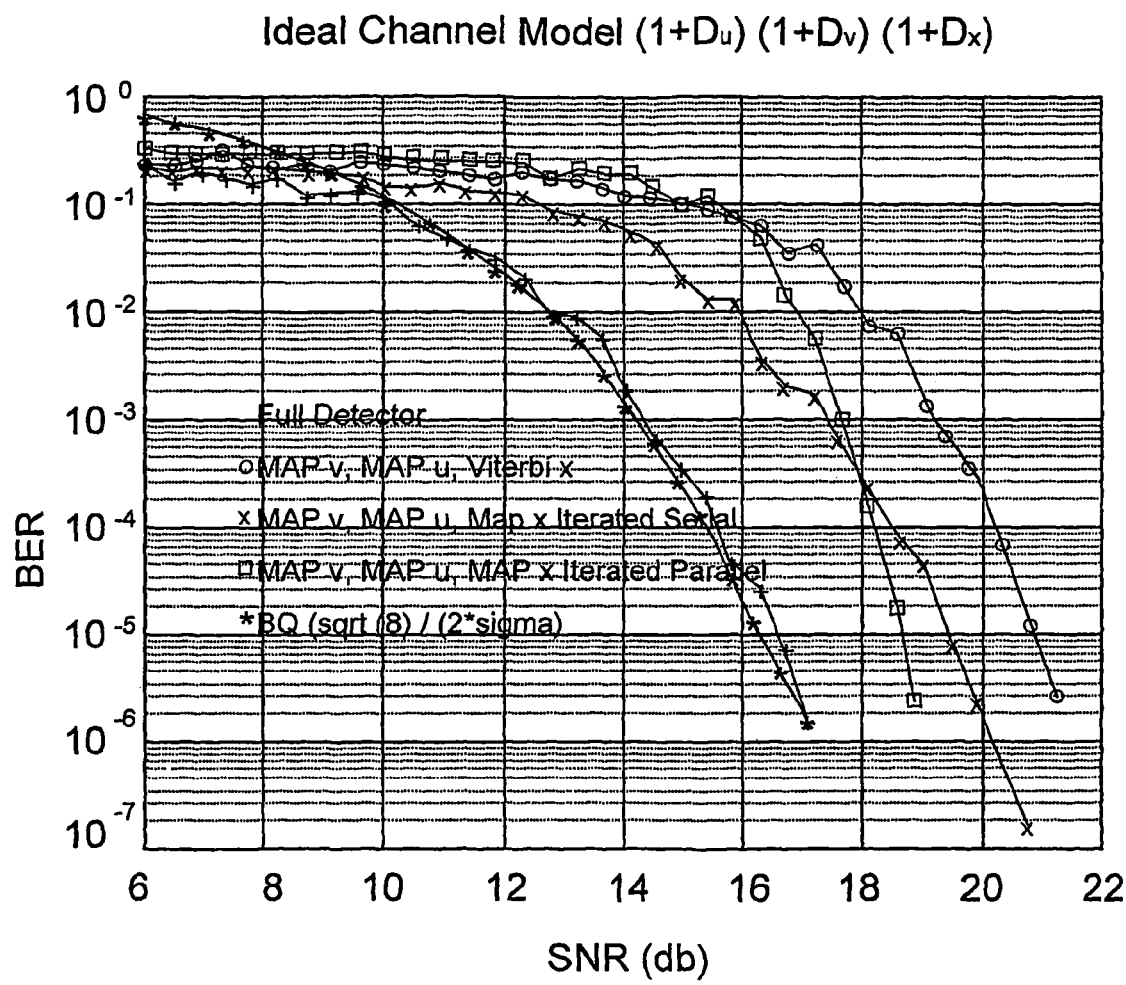
FIG. 5 is a plot of simulation performance.

FIG. 5 shows the simulated performance of the example detection scheme. This shows the 1+D response. It will be appreciated that the performance approaches the ideal detector performance, yet at a fraction of the implementation complexity. This has been achieved because the problem of detecting data with two dimensional ISI has been achieved by decomposing it into a number of 1 dimensional detectors. Such detectors are well understood and easily implemented. It will also be appreciated that the invention provides for decomposition of the response over a hexagonal lattice into 3 partial responses in each of the 3 identified directions. If these partial responses are of the form 1+D the resulting overall response is one of immediate usefulness.

Figure 6:
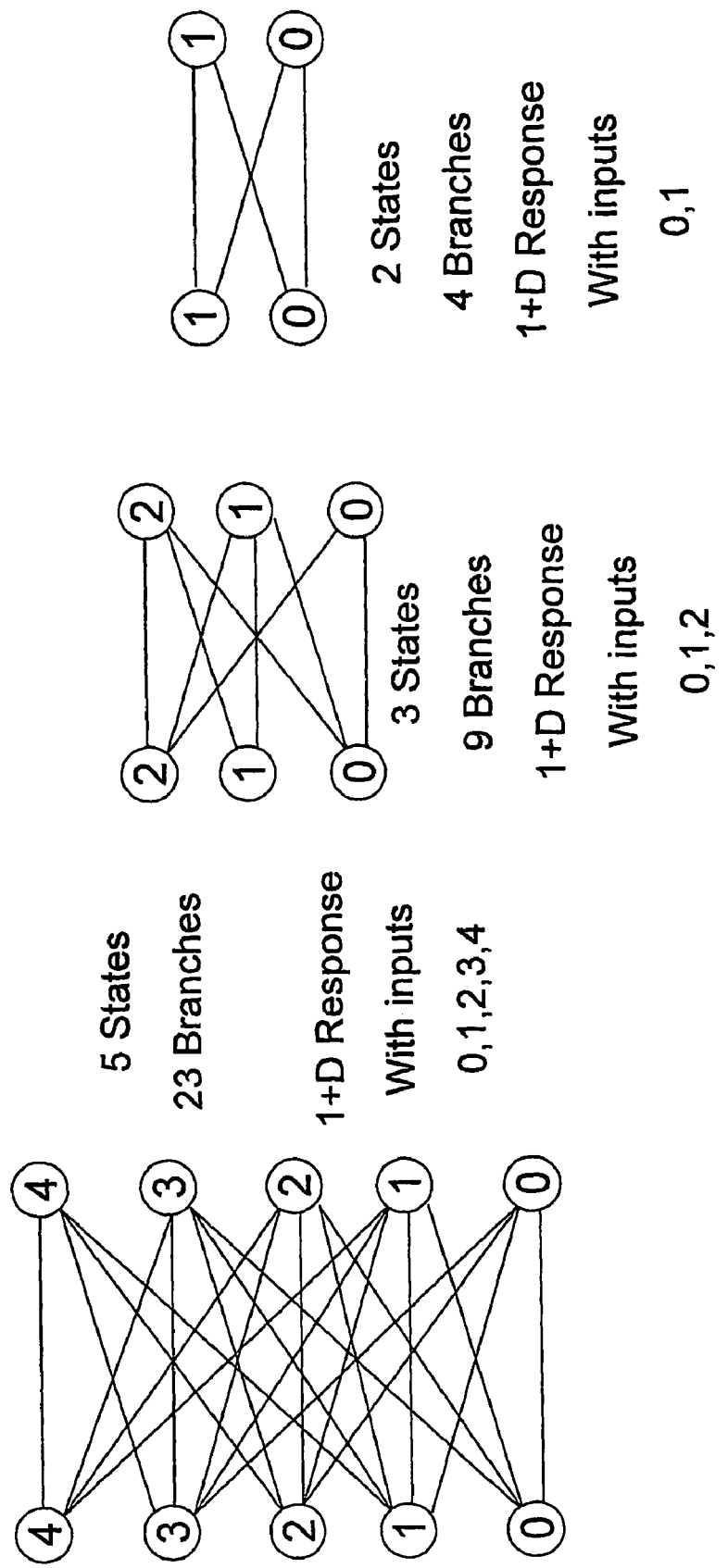
FIG. 6 is a set of diagrams of trellis paths.

Referring to FIG. 6 the trellis for the three detectors of FIG. 1 are shown. The largest is of course that for the $1+D_v$ in which there are five states and 23 branches.

Figure 7:
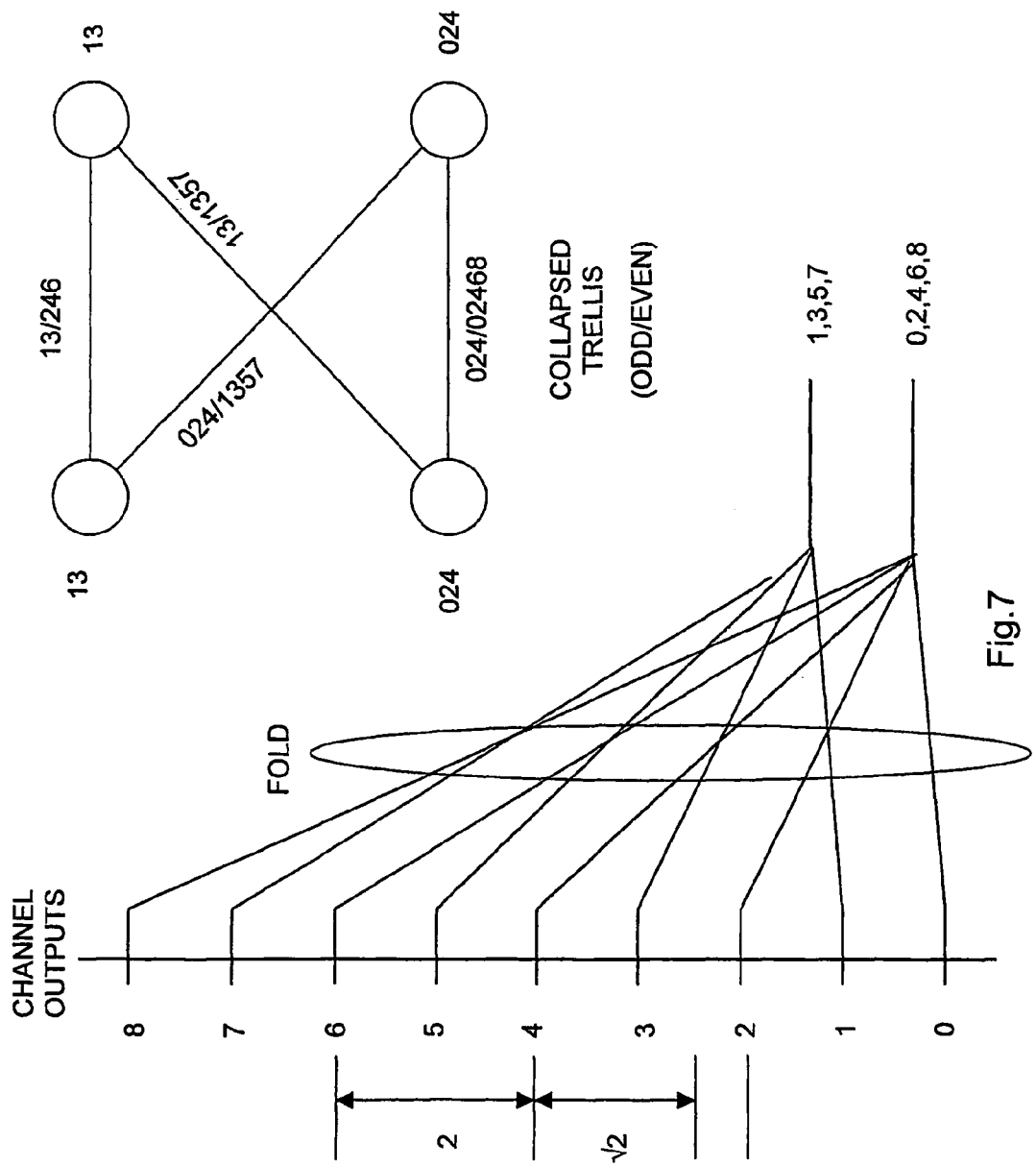
FIG. 7 is a diagram illustrating trellis "folding" of the invention.

Referring to FIG. 7 the first trellis may be considerably simplified by grouping odd states together and grouping even states together a "folded" trellis. This is on the basis that any one state (e.g. state 3) can not be confused with the states on either side (for state 3, states 2 and 4). In the Matched Spectel Null theorem, the $d_{min}$ of channel sequences is $\sqrt{2}$. Therefore, confusion between a state and a second nearest neighbour (e.g. between 3 and 5) does not matter. This approach provides a collapsed trellis as shown in FIG. 7, mapping to an odd state at the top right hand side and to an even state at the bottom right hand side.

Figure 8:
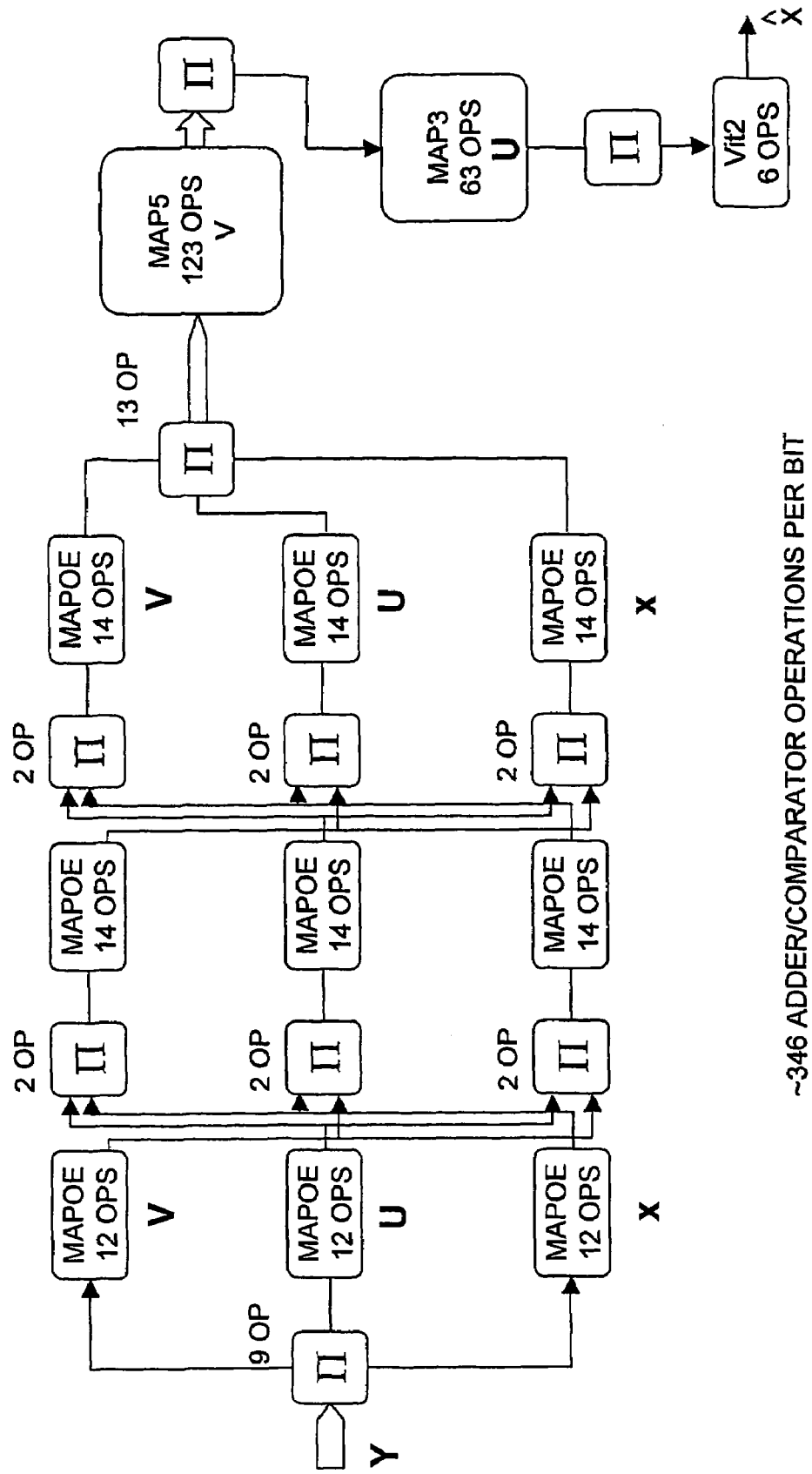
FIGS. 8 and 9 are diagrams of systems incorporating folded trellis.
Figure 9:
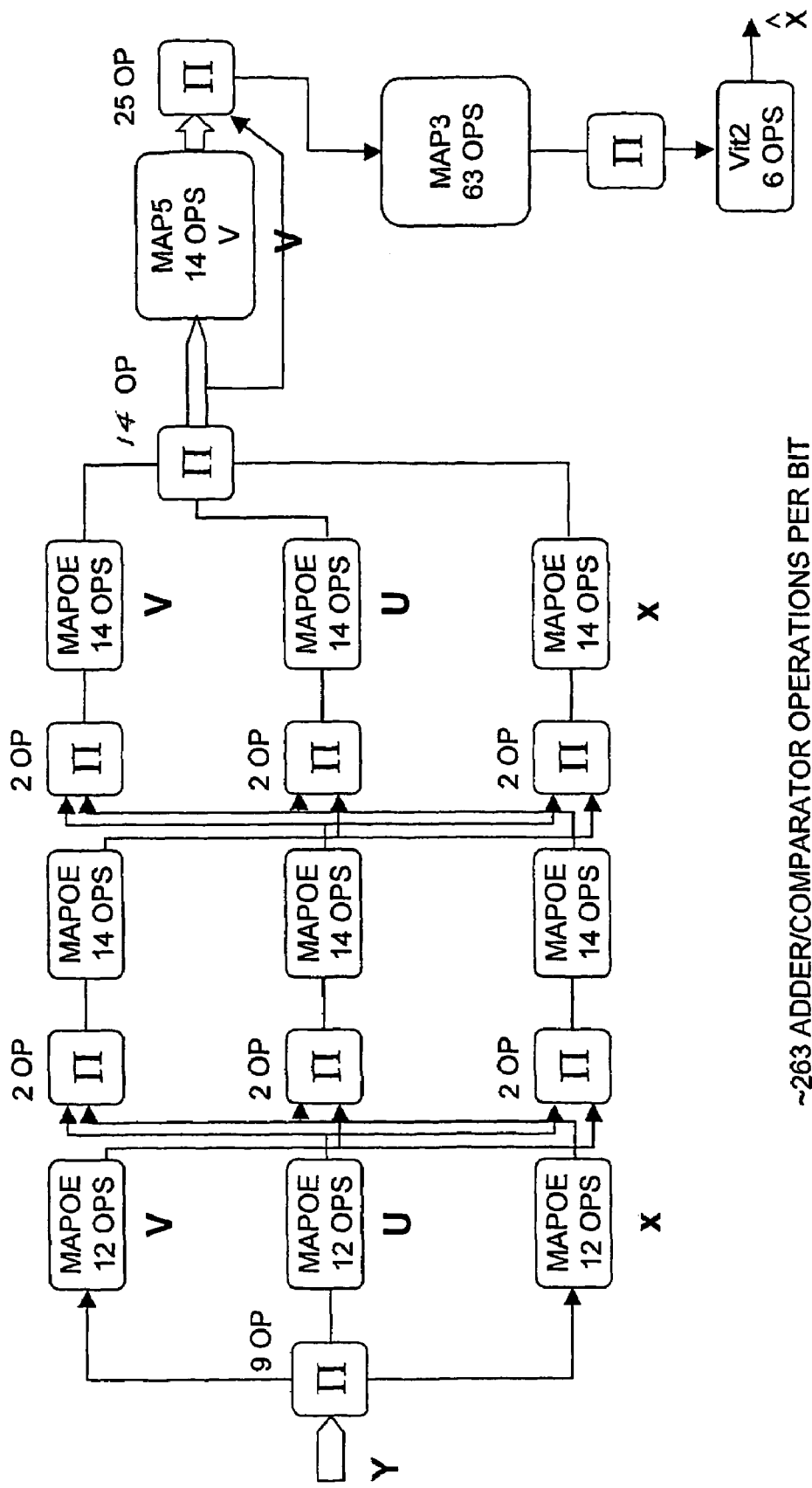

A hardware implementation of this scheme is shown in FIG. 8. In each detector there are only 12 or 14 operations ("ops") instead of in the region of 123 to 169 per detector otherwise. The term "MAPOE" means MAP(OddEven). The system of FIG. 8 uses the "folding" technique for the parallel iterations with three iterations shown in this diagram. For final decoding there is a serial combination of MAP5, MAP3, and VIT2 to give the final bit decision. Referring to FIG. 9, a detector system is shown, in which the final serial combination of the FIG. 8 system is replaced by a folded trellis (MAPOE) to achieve fewer operations overall.

In another embodiment, the folded trellis detector may map from many to greater than one state, such as even states to two even states.

It will also be appreciated that detection for such a response could be practically achieved by application of soft decision detectors in each of the 3 directions independently and combining the results. Iterating this procedure by feeding back likelihood information provides even improved performance and some example architectures for such detectors and their performance is achieved.

However, it should be noted that the disclosed method can be applied more generally. In fact the use of any 3 partial responses $P_1(D_u)P_2(D_x)P_3(D_v)$ can be detected in a similar fashion. For example the use of $P^1(D)=P_2(D)=P_3(D)=1+2D+D^2$ provides an overall hexagonal response which should be useful where even more ISI in each direction is present. Also, the disclosed methods are not limited to the case where the 3 partial responses are equal i.e. $P_1(D) \neq P_2(D) \neq P_3(D)$ which should be suitable for a channel with asymmetry.

Furthermore, the performance of the method can be improved by the iteration of the soft decision detectors using information obtained from previous application of the other detectors as is well known in the field of iterative decoders for turbo codes and LDPC codes.

The invention is not limited to the embodiments described but may be varied in construction and detail.

The invention claimed is:

1. A method carried out by at least one detector and a processor for processing stored data read from a storage medium in which the data is stored in a lattice arrangement of symbols, the method comprising the steps of:
   (a) generating an estimate for each symbol in a linear dimension in a first detector;
   (b) generating an estimate for each symbol in a different non-orthogonal linear dimension in a second detector; and
   (c) generating a decision for a symbol at the intersection of the dimensions using all estimates in the processor.

2. The method as claimed in claim 1, wherein the method comprises the further step of generating a set of estimates for a third linear dimension intersecting the symbol, and additionally using these estimates for the decision.

3. The method as claimed in claim 1, wherein the method comprises the further step of generating a set of estimates for a third linear dimension intersecting the symbol, and additionally using these estimates for the decision; and wherein the lattice is hexagonal.

4. The method as claimed in claim 1, wherein the method comprises the further step of generating a set of estimates for a third linear dimension intersecting the symbol, and additionally using these estimates for the decision; and wherein the lattice is hexagonal; and wherein the method comprises the further step of generating a set of estimates for a third linear dimension intersecting the symbol, and additionally using these estimates for the decision; and the three dimensions intersect the intersection symbol at 60° mutual angles.

5. The method as claimed in claim 1, wherein the first and second detectors are soft decision detectors, the soft decision detectors are used for the dimension estimates, and a Viterbi decoder is used for the symbol decision.

6. The method as claimed in claim 1, wherein the first and second detectors are soft decision detectors, the soft decision detectors are used for the dimension estimates, and a Viterbi decoder is used for the symbol decision; and wherein the Viterbi detector also generates an estimate for a dimension before generating the symbol decision.

7. The method as claimed in claim 1, wherein the detectors for each dimension implement a 1+D MAP algorithm.

8. The method as claimed in claim 1, comprising the further steps of the iterating by feeding back estimates for the symbols of a final dimension to the preceding dimension detectors as a priori information.

9. The method as claimed in claim 8, wherein the iterations are performed by different detectors.

10. The method as claimed in claim 1, wherein estimates are generated by the processor for each dimension in parallel by detectors receiving input samples in parallel.

11. A system for processing stored data read from a storage medium in which the data is stored in a lattice arrangement of symbols, comprising:
    (a) a first detector for generating an estimate for each symbol in a linear dimension;
    (b) a second detector for generating an estimate for each symbol in a different non-orthogonal linear dimension; and
    (c) the processor for using all estimates to generate a decision for a symbol at the intersection of the dimensions; wherein the detector for a first dimension has more status than the second detector for a second dimension, and the second detector has more status than a third detector for a third dimension, said detectors being in series.

12. The system as claimed in claim 11, wherein said first detector has five states with inputs 0, 1, 2, 3, 4, the second detector has three states with inputs 0, 1, 2, and the third detector has two states with inputs 0, 1.

13. The system as claimed in claim 12, wherein outputs of each detector are fed back to the other detectors.

14. A system for processing stored data read from a storage medium in which the data is stored in a lattice arrangement of symbols, comprising:
    (a) a first detector for generating an estimate for each symbol in a linear dimension;
    (b) a second detector for generating an estimate for each symbol in a different non-orthogonal linear dimension; and
    (c) the processor for using all estimates to generate a decision for a symbol at the intersection of the dimensions; wherein the first dimension estimate detector implements a folded trellis with mapping to a reduced number of states.

15. The system as claimed in claim 14, wherein all even states are mapped to an even state and all odd states are mapped to an odd state.

* * * * *